(12) United States Patent
Chow et al.

(10) Patent No.: US 7,768,125 B2
(45) Date of Patent: Aug. 3, 2010

(54) MULTI-CHIP PACKAGE SYSTEM

(75) Inventors: Seng Guan Chow, Singapore (SG); Heap Hoe Kuan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 415 days.

(21) Appl. No.: 11/326,211

(22) Filed: Jan. 4, 2006

(65) Prior Publication Data

US 2007/0158809 A1 Jul. 12, 2007

(51) Int. Cl.
H01L 23/52 (2006.01)
H01L 23/48 (2006.01)
H01L 29/40 (2006.01)

(52) U.S. Cl. ............... 257/738; 257/E21.508; 257/686; 257/777; 438/110; 438/112; 438/613

(58) Field of Classification Search .......... 257/E21.508, 257/E23.075, 777, 692, 738, 686, 685, 713, 257/E21.504, E21.705, E23.061, E25.006, 257/680, 701, 705, 707, 720, 737; 174/260; 228/180.22; 438/613, 65, 110, 112

See application file for complete search history.

(56) References Cited

U.S. PATENT DOCUMENTS

| | | | |
|---|---|---|---|
| 4,524,121 A | 6/1985 | Gleim et al. | |
| 4,697,203 A | 9/1987 | Sakai et al. | |
| 4,764,804 A * | 8/1988 | Sahara et al. | 257/717 |
| 4,894,707 A | 1/1990 | Yamawaki et al. | |
| 5,186,383 A * | 2/1993 | Melton et al. | 228/180.22 |
| 5,214,307 A | 5/1993 | Davis | |
| 5,214,308 A * | 5/1993 | Nishiguchi et al. | 257/692 |
| 5,222,014 A | 6/1993 | Lin | |
| 5,229,960 A | 7/1993 | De Givry | |
| 5,269,453 A * | 12/1993 | Melton et al. | 228/180.22 |
| 5,340,771 A | 8/1994 | Rostoker | |
| 5,373,189 A | 12/1994 | Massit et al. | |
| 5,436,203 A | 7/1995 | Lin | |
| 5,444,296 A | 8/1995 | Kaul et al. | |
| 5,495,398 A | 2/1996 | Takiar et al. | |
| 5,550,711 A | 8/1996 | Burns et al. | |
| 5,579,207 A | 11/1996 | Hayden et al. | |
| 5,607,227 A | 3/1997 | Yasumoto et al. | |
| 5,650,667 A | 7/1997 | Liou | |
| 5,652,185 A | 7/1997 | Lee | |
| 5,734,199 A * | 3/1998 | Kawakita et al. | 257/737 |
| 5,744,863 A | 4/1998 | Culnane et al. | |
| 5,748,452 A | 5/1998 | Londa | |

(Continued)

FOREIGN PATENT DOCUMENTS

EP 0 430 458 A2 6/1991

(Continued)

OTHER PUBLICATIONS

Kim, J. and Boruch, J., "Enabling a Microelectronic WorldTM", AMKOR Technology, Inc.2002 Annual Report, retrieved from Internet:<URL:http://media.corporate-ir.net/media_files/iro/11/115640/2002AnnualReport.pdf.

*Primary Examiner*—Chris Chu
(74) *Attorney, Agent, or Firm*—Mikio Ishimaru

(57) ABSTRACT

A chip package system is provided including providing a chip having interconnects provided thereon; forming a molding compound on the chip and encapsulating the interconnects; and forming a recess in the molding compound above the interconnects to expose the interconnects.

20 Claims, 7 Drawing Sheets

U.S. PATENT DOCUMENTS

| | | | |
|---|---|---|---|
| 5,760,478 A * | 6/1998 | Bozso et al. | 257/777 |
| 5,811,351 A * | 9/1998 | Kawakita et al. | 438/613 |
| 5,824,569 A * | 10/1998 | Brooks et al. | 438/127 |
| 5,828,128 A * | 10/1998 | Higashiguchi et al. | 257/738 |
| 5,844,315 A | 12/1998 | Melton et al. | |
| 5,854,507 A | 12/1998 | Miremadi et al. | |
| 5,898,219 A | 4/1999 | Barrow | |
| 5,899,705 A | 5/1999 | Akram | |
| 5,903,049 A | 5/1999 | Mori | |
| 5,963,430 A | 10/1999 | Londa | |
| 5,977,640 A * | 11/1999 | Bertin et al. | 257/777 |
| 5,977,641 A * | 11/1999 | Takahashi et al. | 257/778 |
| 5,982,633 A | 11/1999 | Jeansonne | |
| 5,994,166 A | 11/1999 | Akram et al. | |
| 6,025,648 A | 2/2000 | Takahashi et al. | |
| RE36,613 E | 3/2000 | Ball | |
| 6,034,875 A | 3/2000 | Heim et al. | |
| 6,075,289 A | 6/2000 | Distefano | |
| 6,083,775 A | 7/2000 | Huang et al. | |
| 6,083,811 A | 7/2000 | Riding et al. | |
| 6,101,100 A | 8/2000 | Londa | |
| 6,107,164 A * | 8/2000 | Ohuchi | 438/465 |
| 6,118,176 A | 9/2000 | Tao et al. | |
| 6,121,682 A * | 9/2000 | Kim | 257/723 |
| 6,130,448 A | 10/2000 | Bauer et al. | |
| 6,143,588 A | 11/2000 | Glenn | |
| 6,144,507 A | 11/2000 | Hashimoto | |
| 6,157,080 A | 12/2000 | Tamaki et al. | |
| 6,165,815 A | 12/2000 | Ball | |
| 6,201,266 B1 | 3/2001 | Ohuchi et al. | |
| 6,201,302 B1 | 3/2001 | Tzu | |
| 6,204,562 B1 | 3/2001 | Ho et al. | |
| 6,225,699 B1 * | 5/2001 | Ference et al. | 257/777 |
| 6,238,949 B1 | 5/2001 | Nguyen et al. | |
| 6,242,932 B1 | 6/2001 | Hembree | |
| 6,246,123 B1 | 6/2001 | Landers, Jr. et al. | |
| 6,265,766 B1 | 7/2001 | Moden | |
| 6,266,197 B1 | 7/2001 | Glenn et al. | |
| 6,274,930 B1 | 8/2001 | Vaiyapuri et al. | |
| 6,291,263 B1 | 9/2001 | Huang | |
| 6,294,406 B1 * | 9/2001 | Bertin et al. | 438/109 |
| 6,297,131 B1 | 10/2001 | Yamada et al. | |
| 6,316,735 B1 * | 11/2001 | Higashiguchi | 174/260 |
| 6,316,838 B1 | 11/2001 | Ozawa et al. | |
| 6,333,552 B1 | 12/2001 | Kakimoto et al. | |
| 6,340,846 B1 | 1/2002 | LoBianco et al. | |
| 6,353,257 B1 | 3/2002 | Huang | |
| 6,358,773 B1 | 3/2002 | Lin et al. | |
| 6,369,454 B1 | 4/2002 | Chung | |
| 6,372,551 B1 | 4/2002 | Huang | |
| 6,376,904 B1 | 4/2002 | Haba et al. | |
| 6,379,988 B1 | 4/2002 | Peterson et al. | |
| 6,384,472 B1 | 5/2002 | Huang | |
| 6,388,313 B1 | 5/2002 | Lee et al. | |
| 6,400,007 B1 | 6/2002 | Wu et al. | |
| 6,407,381 B1 | 6/2002 | Glenn et al. | |
| 6,407,456 B1 | 6/2002 | Ball | |
| 6,410,861 B1 * | 6/2002 | Huang et al. | 174/260 |
| 6,413,798 B2 | 7/2002 | Asada | |
| 6,414,381 B1 | 7/2002 | Takeda | |
| 6,420,204 B2 | 7/2002 | Glenn | |
| 6,420,244 B2 | 7/2002 | Lee | |
| 6,424,050 B1 | 7/2002 | Komiyama | |
| 6,441,496 B1 | 8/2002 | Chen et al. | |
| 6,445,064 B1 | 9/2002 | Ishii et al. | |
| 6,455,353 B2 | 9/2002 | Lin | |
| 6,462,421 B1 | 10/2002 | Hsu et al. | |
| 6,472,732 B1 | 10/2002 | Terui | |
| 6,489,676 B2 | 12/2002 | Taniguchi et al. | |
| 6,492,726 B1 | 12/2002 | Quek et al. | |
| 6,501,165 B1 | 12/2002 | Farnworth et al. | |
| 6,503,780 B1 | 1/2003 | Glenn et al. | |
| 6,509,639 B1 | 1/2003 | Lin | |
| 6,512,219 B1 | 1/2003 | Webster et al. | |
| 6,512,303 B2 | 1/2003 | Moden | |
| 6,529,027 B1 | 3/2003 | Akram et al. | |
| 6,534,419 B1 | 3/2003 | Ong | |
| 6,538,319 B2 | 3/2003 | Terui | |
| 6,541,857 B2 * | 4/2003 | Caletka et al. | 257/738 |
| 6,545,365 B2 | 4/2003 | Kondo et al. | |
| 6,545,366 B2 | 4/2003 | Michii et al. | |
| 6,552,423 B2 | 4/2003 | Song et al. | |
| 6,555,902 B2 | 4/2003 | Lo et al. | |
| 6,555,917 B1 | 4/2003 | Heo | |
| 6,566,745 B1 | 5/2003 | Beyne et al. | |
| 6,570,249 B1 | 5/2003 | Liao et al. | |
| 6,580,169 B2 * | 6/2003 | Sakuyama et al. | 257/738 |
| 6,583,503 B2 | 6/2003 | Akram et al. | |
| 6,590,281 B2 | 7/2003 | Wu et al. | |
| 6,593,647 B2 | 7/2003 | Ichikawa | |
| 6,593,648 B2 | 7/2003 | Emoto | |
| 6,593,662 B1 | 7/2003 | Pu et al. | |
| 6,599,779 B2 | 7/2003 | Shim et al. | |
| 6,607,937 B1 | 8/2003 | Corisis | |
| 6,610,563 B1 | 8/2003 | Waitl et al. | |
| 6,611,063 B1 | 8/2003 | Ichinose et al. | |
| 6,613,980 B1 | 9/2003 | McGhee et al. | |
| 6,617,198 B2 | 9/2003 | Brooks | |
| 6,621,169 B2 | 9/2003 | Kikuma et al. | |
| 6,621,172 B2 | 9/2003 | Nakayama et al. | |
| 6,627,864 B1 | 9/2003 | Glenn et al. | |
| 6,627,979 B2 * | 9/2003 | Park | 257/667 |
| 6,642,609 B1 | 11/2003 | Minamio et al. | |
| 6,649,445 B1 * | 11/2003 | Qi et al. | 438/108 |
| 6,649,448 B2 | 11/2003 | Tomihara | |
| 6,650,019 B2 | 11/2003 | Glenn et al. | |
| 6,667,556 B2 | 12/2003 | Moden | |
| 6,674,156 B1 | 1/2004 | Bayan et al. | |
| 6,690,089 B2 | 2/2004 | Uchida | |
| 6,692,993 B2 | 2/2004 | Li et al. | |
| 6,693,364 B2 | 2/2004 | Tao et al. | |
| 6,700,178 B2 | 3/2004 | Chen et al. | |
| 6,700,192 B2 | 3/2004 | Matsuzawa et al. | |
| 6,706,557 B2 | 3/2004 | Koopmans | |
| 6,707,140 B1 | 3/2004 | Nguyen et al. | |
| 6,713,366 B2 | 3/2004 | Mong et al. | |
| 6,716,670 B1 | 4/2004 | Chiang | |
| 6,734,539 B2 | 5/2004 | Degani et al. | |
| 6,734,552 B2 | 5/2004 | Combs et al. | |
| 6,734,569 B2 | 5/2004 | Appelt et al. | |
| 6,737,750 B1 | 5/2004 | Hoffman et al. | |
| 6,740,980 B2 * | 5/2004 | Hirose | 257/777 |
| 6,746,894 B2 | 6/2004 | Fee et al. | |
| 6,747,361 B2 | 6/2004 | Ichinose | |
| 6,762,488 B2 | 7/2004 | Maeda et al. | |
| 6,774,475 B2 | 8/2004 | Blackshear et al. | |
| 6,777,799 B2 | 8/2004 | Kikuma et al. | |
| 6,777,819 B2 | 8/2004 | Huang | |
| 6,784,534 B1 | 8/2004 | Glenn et al. | |
| 6,787,915 B2 | 9/2004 | Uchida et al. | |
| 6,787,916 B2 | 9/2004 | Halahan | |
| 6,791,036 B1 | 9/2004 | Chen et al. | |
| 6,791,076 B2 | 9/2004 | Webster | |
| 6,791,168 B1 | 9/2004 | Connell et al. | |
| 6,794,741 B1 | 9/2004 | Lin et al. | |
| 6,794,749 B2 | 9/2004 | Akram | |
| 6,809,405 B2 | 10/2004 | Ito et al. | |
| 6,815,254 B2 | 11/2004 | Mistry et al. | |
| 6,818,980 B1 | 11/2004 | Pedron, Jr. | |
| 6,828,665 B2 | 12/2004 | Pu et al. | |
| 6,833,612 B2 | 12/2004 | Kinsman | |
| 6,835,598 B2 | 12/2004 | Baek et al. | |
| 6,838,761 B2 | 1/2005 | Karnezos | |
| 6,847,105 B2 | 1/2005 | Koopmans | |

| | | |
|---|---|---|
| 6,847,109 B2 | 1/2005 | Shim |
| 6,851,598 B2 * | 2/2005 | Gebauer et al. ......... 228/180.22 |
| 6,852,570 B2 * | 2/2005 | Hasegawa ................... 438/107 |
| 6,861,288 B2 | 3/2005 | Shim et al. |
| 6,861,683 B2 | 3/2005 | Rissing et al. |
| 6,864,566 B2 | 3/2005 | Choi |
| 6,881,611 B1 * | 4/2005 | Fukasawa et al. ........... 438/114 |
| 6,882,057 B2 | 4/2005 | Hsu |
| 6,890,798 B2 | 5/2005 | McMahon |
| 6,891,239 B2 | 5/2005 | Anderson et al. |
| 6,900,079 B2 | 5/2005 | Kinsman et al. |
| 6,900,528 B2 | 5/2005 | Mess et al. |
| 6,900,549 B2 | 5/2005 | Brooks |
| 6,906,415 B2 | 6/2005 | Jiang et al. |
| 6,906,416 B2 | 6/2005 | Karnezos |
| 6,916,683 B2 | 7/2005 | Stephenson et al. |
| 6,930,378 B1 | 8/2005 | St. Amand et al. |
| 6,930,396 B2 | 8/2005 | Kurita et al. |
| 6,933,598 B2 | 8/2005 | Karnezos |
| 6,951,982 B2 | 10/2005 | Chye et al. |
| 6,972,481 B2 | 12/2005 | Karnezos |
| 7,034,387 B2 | 4/2006 | Karnezos |
| 7,034,388 B2 | 4/2006 | Yang et al. |
| 7,045,887 B2 | 5/2006 | Karnezos |
| 7,049,691 B2 | 5/2006 | Karnezos |
| 7,053,476 B2 | 5/2006 | Karnezos |
| 7,053,477 B2 | 5/2006 | Karnezos et al. |
| 7,057,269 B2 | 6/2006 | Karnezos |
| 7,061,088 B2 | 6/2006 | Karnezos |
| 7,064,426 B2 | 6/2006 | Karnezos |
| 7,071,568 B1 | 7/2006 | St. Amand et al. |
| 7,081,678 B2 | 7/2006 | Liu |
| 7,084,500 B2 * | 8/2006 | Swnson et al. .............. 257/738 |
| 7,090,482 B2 * | 8/2006 | Tsukahara et al. ........... 425/149 |
| 7,093,358 B2 | 8/2006 | Akram et al. |
| 7,101,731 B2 | 9/2006 | Karnezos |
| 7,109,574 B2 | 9/2006 | Chiu et al. |
| 7,115,990 B2 | 10/2006 | Kinsman |
| 7,119,427 B2 | 10/2006 | Kim |
| 7,122,906 B2 * | 10/2006 | Doan ......................... 257/778 |
| 7,176,506 B2 | 2/2007 | Beroz et al. |
| 7,183,191 B2 | 2/2007 | Kinsman et al. |
| 7,218,005 B2 * | 5/2007 | Tago ........................... 257/777 |
| 7,221,059 B2 * | 5/2007 | Farnworth et al. ........... 257/778 |
| 7,298,045 B2 | 11/2007 | Fujitani et al. |
| 7,335,994 B2 * | 2/2008 | Klein et al. .................. 257/778 |
| 7,355,274 B2 | 4/2008 | Lim |
| 7,364,945 B2 | 4/2008 | Shim et al. |
| 7,372,141 B2 | 5/2008 | Karnezos et al. |
| 7,456,088 B2 | 11/2008 | Park et al. |
| 2001/0055834 A1 | 12/2001 | Lin |
| 2002/0024124 A1 * | 2/2002 | Hashimoto ................... 257/678 |
| 2002/0096755 A1 | 7/2002 | Fukui et al. |
| 2002/0100955 A1 * | 8/2002 | Potter et al. .................. 257/522 |
| 2002/0130404 A1 | 9/2002 | Ushijima et al. |
| 2003/0008510 A1 | 1/2003 | Grigg et al. |
| 2003/0038347 A1 | 2/2003 | Chiu et al. |
| 2003/0113952 A1 | 6/2003 | Sambasivam et al. |
| 2003/0153134 A1 | 8/2003 | Kawata et al. |
| 2004/0016939 A1 | 1/2004 | Akiba et al. |
| 2004/0061213 A1 | 4/2004 | Karnezos |
| 2004/0119153 A1 | 6/2004 | Karnezos |
| 2004/0124540 A1 * | 7/2004 | Chen et al. ................... 257/777 |
| 2004/0166605 A1 | 8/2004 | Kuratomi et al. |
| 2004/0201087 A1 | 10/2004 | Lee |
| 2004/0212096 A1 | 10/2004 | Wang |
| 2005/0051882 A1 | 3/2005 | Kwon et al. |
| 2005/0075053 A1 | 4/2005 | Jung |
| 2006/0043556 A1 | 3/2006 | Su et al. |
| 2006/0065958 A1 | 3/2006 | Tsao et al. |
| 2006/0073635 A1 | 4/2006 | Su et al. |
| 2006/0138631 A1 | 6/2006 | Tao et al. |
| 2006/0189033 A1 | 8/2006 | Kim |
| 2006/0197209 A1 | 9/2006 | Choi et al. |
| 2006/0244157 A1 | 11/2006 | Carson |
| 2007/0141751 A1 | 6/2007 | Mistry et al. |
| 2007/0148822 A1 | 6/2007 | Haba et al. |
| 2007/0166867 A1 | 7/2007 | Chow et al. |

FOREIGN PATENT DOCUMENTS

| | | |
|---|---|---|
| EP | 0 652 630 A2 | 5/1995 |
| JP | 05152505 A | 6/1993 |
| JP | 2001223326 A | 8/2001 |
| KR | 2001068614 A | 7/2001 |
| KR | 2004085348 A | 10/2004 |
| WO | 98/50954 A1 | 11/1998 |
| WO | 02/084716 A2 | 10/2002 |
| WO | 03/032370 A2 | 4/2003 |

* cited by examiner

MULTI-CHIP PACKAGE SYSTEM

CROSS-REFERENCE TO RELATED APPLICATION(S)

The present application contains subject matter related to concurrently filed U.S. patent application Ser. No. 11/306, 627, now U.S. Pat. No. 7,456,088. The related application is assigned to STATS ChipPAC Ltd. and the subject matter thereof is hereby incorporated by reference thereto.

The present application also contains subject matter related to concurrently filed U.S. patent application Ser. No. 11/326, 206. The related application is assigned to STATS ChipPAC Ltd. and the subject matter thereof is hereby incorporated by reference thereto.

The present application also contains subject matter related to concurrently filed U.S. patent application Ser. No. 11/306, 628, now U.S. Pat. No. 7,364, 945. The related application is assigned to STATS ChipPAC Ltd. and is the subject matter thereof is hereby incorporated by reference thereto.

TECHNICAL FIELD

The present invention relates generally to integrated circuit package systems, and more particularly to a multi-chip package system.

BACKGROUND ART

In the electronics industry, as products such as cell phones and camcorders become smaller and smaller, increased miniaturization of integrated circuit (IC) or chip packages has become more and more critical. At the same time, higher performance and lower cost have become essential for new products.

Usually, many individual integrated circuit devices are constructed on the same wafer and groups of integrated circuit devices are separated into individual integrated circuit die.

One approach to putting more integrated circuit dies in a single package involves stacking the dies with space between the dies for wire bonding. The space is achieved by means of a thick layer of organic adhesive or in combination with inorganic spacers of material such as silicon (Si), ceramic, or metal. Unfortunately, the stacking adversely affects the performance of the package because of decreased thermal performance due to the inability to remove heat through the organic adhesive and/or inorganic spacers. As the number of dies in the stack increases, thermal resistance increases at a faster rate. Further, such stacked dies have a high manufacturing cost.

Generally, semiconductor packages are classified into a variety of types in accordance with their structures. In particular, semiconductor packages are classified into an in-line type and a surface mount type in accordance with their mounting structures. Examples of in-line type semiconductor packages include a dual in-line package (DIP) and a pin grid array (PGA) package. Examples of surface mount type semiconductor packages include quad flat package (QFP) and a ball grid array (BGA) package.

Recently, the use of surface mount type semiconductor packages has increased, as compared to in-line type semiconductor packages, in order to obtain an increased element mounting density of a package board. A conventional semiconductor package has a size considerably larger than that of the semiconductor chip used. For this reason, this semiconductor package cannot meet the recent demand for a light, thin, simple, miniature structure. As a result, it is hard for the conventional semiconductor package to meet the demand for a highly integrated miniature structure.

Furthermore, the fabrication method used to fabricate the conventional semiconductor package involves a relatively large number of processes. For this reason, a need therefore exists for reducing the costs through use of simplified processes. In view of the ever-increasing need to save costs and improve efficiencies, it is more and more critical that answers be found to these problems. Solutions to these problems have been long sought but prior developments have not taught or suggested any solutions and, thus, solutions to these problems have long eluded those skilled in the art.

DISCLOSURE OF THE INVENTION

The present invention provides a chip package system is provided including providing a chip having interconnects provided thereon; forming a molding compound on the chip and encapsulating the interconnects; and forming a recess in the molding compound above the interconnects to expose the interconnects.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
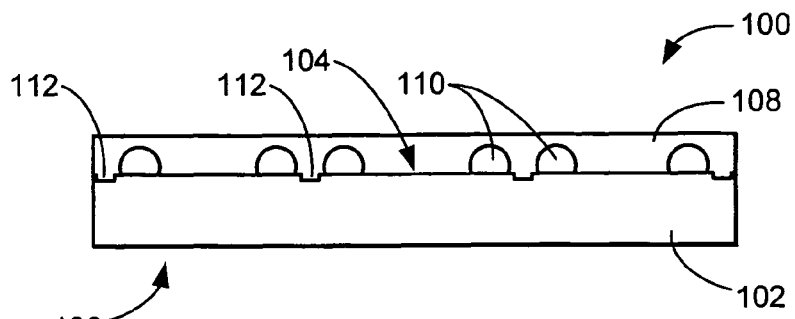
FIG. 1 is a cross-sectional view of a first wafer structure in accordance with an embodiment of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the device are semi-diagrammatic and not to scale and, particularly, some of the dimensions are for the clarity of presentation and are shown greatly exaggerated in the drawing FIGs. Generally, the device can be operated in any orientation. The same numbers are used in all the drawing FIGs. to relate to the same or similar elements.

The term "horizontal" as used herein is defined as a plane parallel to the conventional plane or surface of the wafer, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" includes the meaning of one object being in direct contact with another.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of a first wafer structure 100 in accordance with an embodiment of the present invention. The first wafer structure 100 (the wafer mold) includes a wafer 102 with a top surface 104 and a bottom surface 106.

Interconnects 110 are deposited on the wafer 102. The interconnects 110 are typical of interconnects, such as solder bumps, solder balls, or stud bumps, which may include any electrically conductive material, such as Pb, PbSn, PbSnAg, Au, etc., and be spherical, pillar, or stud shapes.

Saw streets 112 are formed on the top surface 104 of the wafer 102 to define where individual die will be singulated. The interconnects 110 are along edges of the individual dies so the saw streets 112 are positioned between adjacent interconnects 110.

A molding compound 108 is applied on the top surface 104 of the wafer 102. The interconnects 110 and saw streets 112 are embedded in the molding compound 108.

Figure 2:
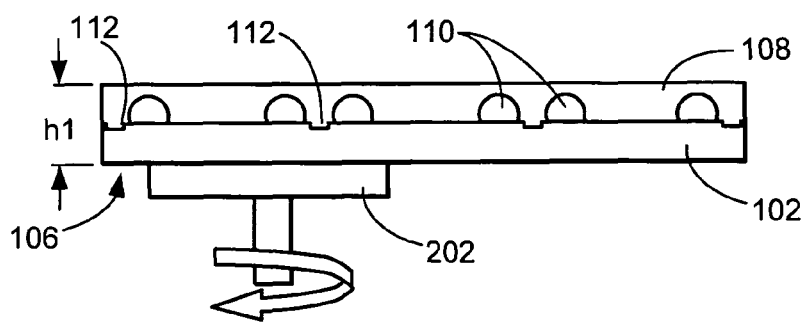
FIG. 2 is the structure of FIG. 1 in a bottom grinding step.

Referring now to FIG. 2, therein is shown the structure of FIG. 1 in a grinding step. The bottom surface 106 of the wafer 102 is planarized to a specified surface flatness and a thickness "h1". In accordance with one embodiment, the bottom surface 106 is planarized by grinding using a grinding wheel 202.

The planarization permits the wafer 102 to be extremely thin but partially supported for strength by the molding compound 108 so it may be safely handled. This extreme thinness also helps reduce the package profile.

Figure 3:
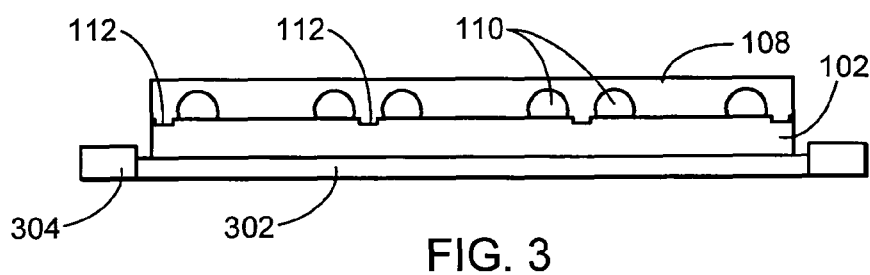
FIG. 3 is the structure of FIG. 2 in a dicing tape lamination step.

Referring now to FIG. 3, therein is shown the structure of FIG. 2 in a dicing tape mounting step in accordance with an embodiment of the present invention. The wafer 102 is mounted on a dicing tape 302 enclosed within a mounting frame 304.

Figure 4:
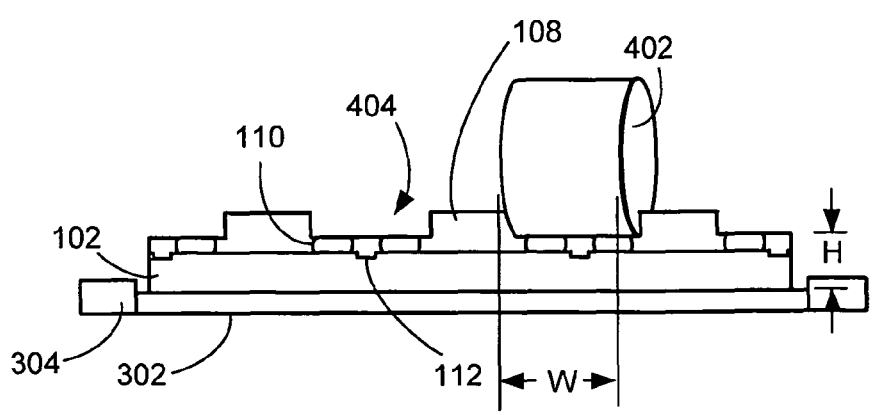
FIG. 4 is the structure of FIG. 3 in a notching step.

Referring now to FIG. 4, therein is shown the structure of FIG. 3 in a notching step. A portion of the molding compound 108 and a portion of the interconnects 110 are cut. For example, a thick saw blade 402 may be used for creating grooves 404 of width "W" on a portion of the surface of the molding compound 108 such that it exposes a portion of the interconnects 110. By planarizing the bottom surface 106 of the wafer 102, the thick saw blade 402 may accurately be positioned relatively to a thickness "H" above the dicing tape 302 for precisely cutting the portion of the interconnects 110.

The grooves 404 reduce the thickness of the molding compound 108, which must be sawn, while the molding compound 108 helps prevent defects during the dicing operation.

Figure 5:
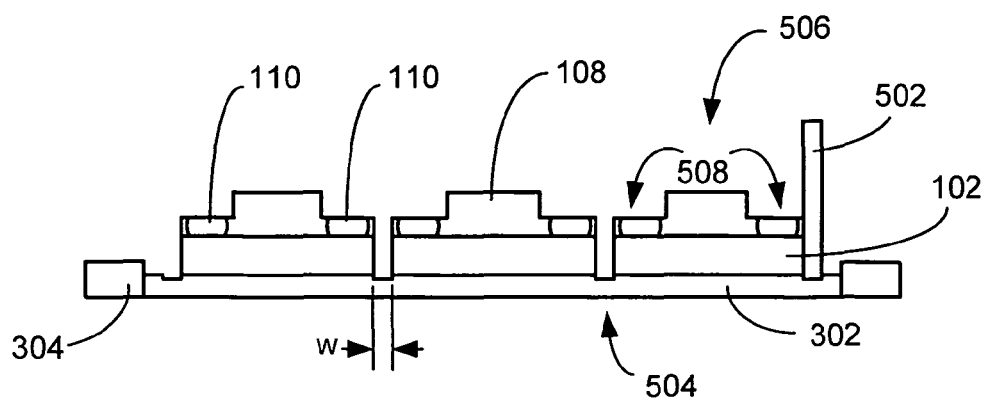
FIG. 5 is the structure of FIG. 4 in a singulation step.

Referring now to FIG. 5, therein is shown the structure of FIG. 4 in a singulation step. A dicing saw 502 may be used for cutting through the wafer 102 and the molding compound 108 remaining to create a cut 504 of width "w" at the saw streets 112 to yield chip packages 506.

The grooves 404 of FIG. 4 form recesses 508 into the edges of the molding compound 108 partially exposing portions of the interconnects 110.

Figure 6:
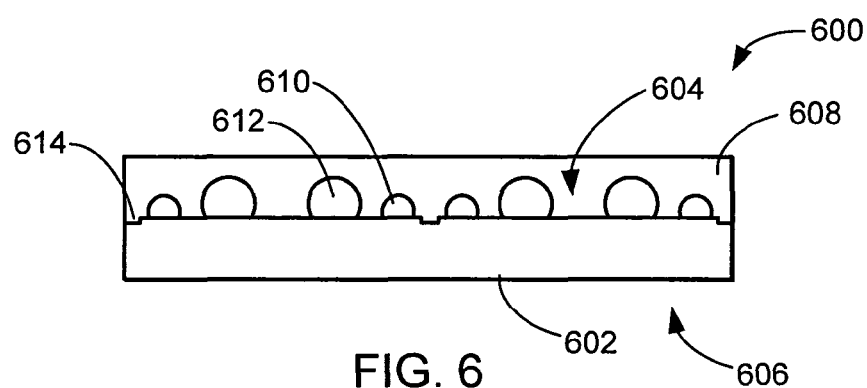
FIG. 6 is a cross-sectional view of a second wafer structure in accordance with another embodiment of the present invention.

Referring now to FIG. 6, therein is shown a cross-sectional view of a second wafer structure 600 in accordance with another embodiment of the present invention. The second wafer structure 600 includes a wafer 602 with a top surface 604 and a bottom surface 606. Small interconnects 610 and large interconnects 612 are deposited on the wafer 602. The "small" and "large" are a convenient designation since the sizes are in relation to each other where the small interconnects are smaller than the large interconnects and the large interconnects are larger than the small interconnects.

Saw streets 614 are formed in a top portion of the top surface 604 of the wafer 602 and fall between two adjacent small interconnects 610. A molding compound 608 is applied on the top surface 604 of the wafer 602. The small interconnects 610 and the large interconnects 612 are embedded within the molding compound 608.

Figure 7:
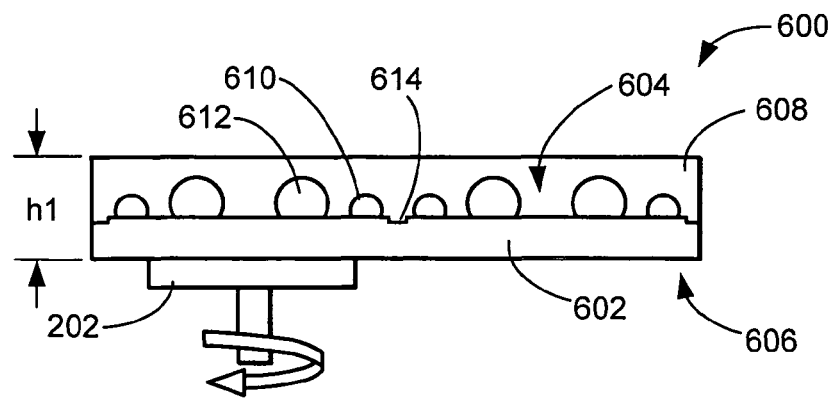
FIG. 7 is the structure of FIG. 6 in a bottom grinding step.

Referring now to FIG. 7, therein is shown the structure of FIG. 6 in a bottom grinding step. The bottom surface 606 of the wafer 602 is planarized to a specified surface flatness and thickness "h1", as an example. In accordance with one embodiment, the bottom surface 606 is planarized by grinding using the grinding wheel 202.

Figure 8:
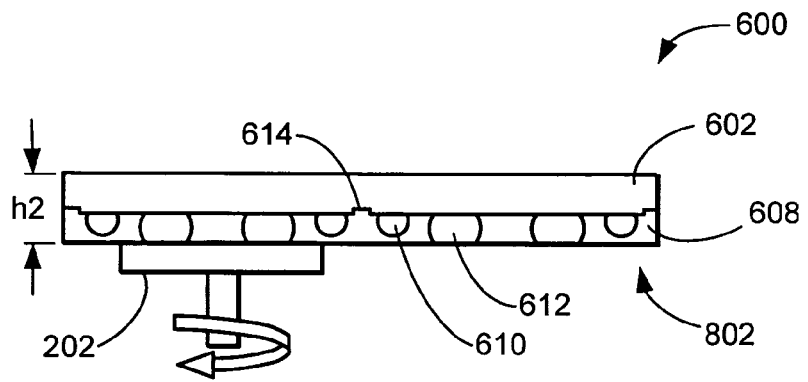
FIG. 8 is the structure of FIG. 7 in a top grinding step.

Referring now to FIG. 8, therein is shown the structure of FIG. 7 in a top grinding step. A portion of the exposed surface 802 of the molding compound 608 is planarized to a thickness of "h2" such that it exposes a portion of the large interconnects 612 while leaving the small interconnects 610 unexposed. In accordance with one embodiment, the portion of the exposed surface 802 of the molding compound 608 is planarized by grinding using the grinding wheel 202.

Figure 9:
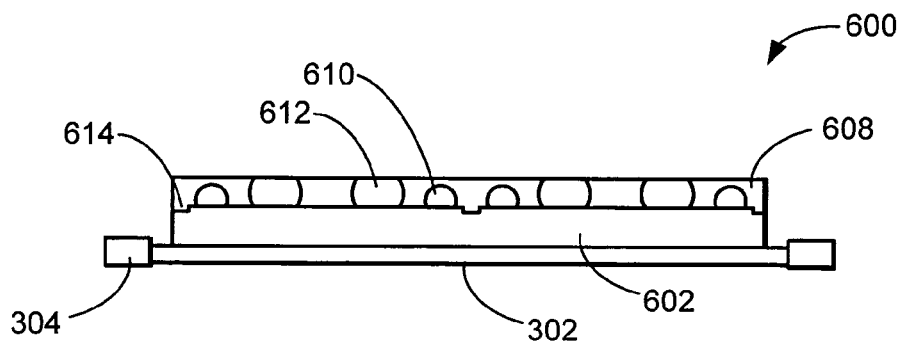
FIG. 9 is the structure of FIG. 8 in a dicing tape lamination step.

Referring now to FIG. 9, therein is shown the structure of FIG. 8 in a dicing tape mounting step. The wafer 602 is mounted on the dicing tape 302 enclosed within the mounting frame 304.

Figure 10:
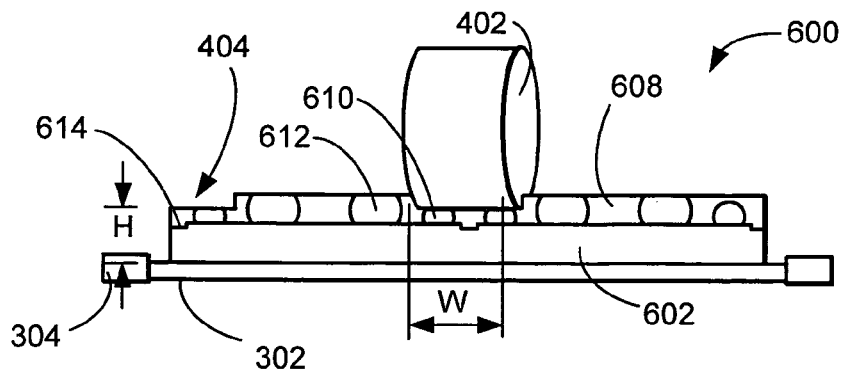
FIG. 10 is the structure of FIG. 9 in a notching step.

Referring now to FIG. 10, therein is shown the structure of FIG. 9 in a notching step. A portion of the molding compound 608 and a portion of the small interconnects 610 are cut. For example, the thick blade 402 may be used for creating the grooves 404 on a portion of the surface of the molding compound 608 such that it exposes a portion of the small interconnects 610. By planarizing the bottom surface 606 of the wafer 602, the thick blade 402 may accurately be positioned relatively to a thickness "H" above the dicing tape 302 for precisely cutting the portion of the interconnects 610.

Figure 11:
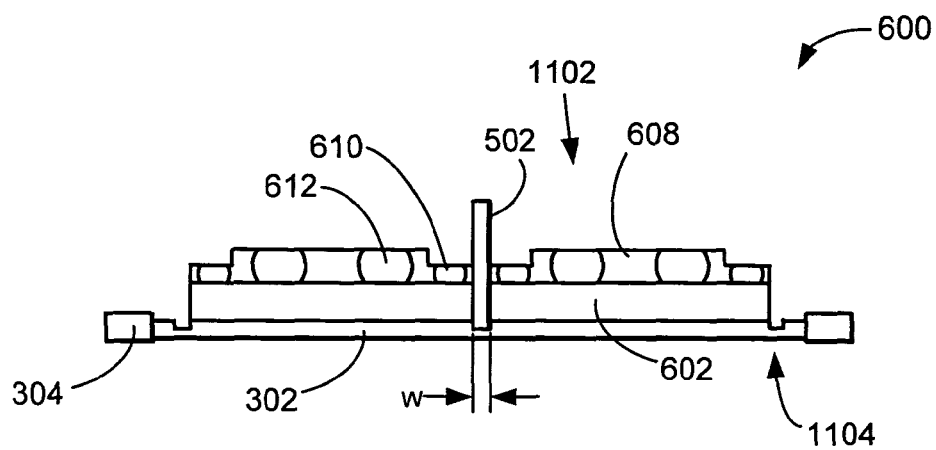
FIG. 11 is the structure of FIG. 10 in a singulation step.

Referring now to FIG. 11, therein is shown the structure of FIG. 10 in a singulation step. The dicing saw 502 of width "W" may be used for cutting through the wafer 602 and the molding compound 608 to create a cut 1104 at the saw streets 614 to yield chip packages 1102 characterized as coming from the wafer 602.

Figure 12:
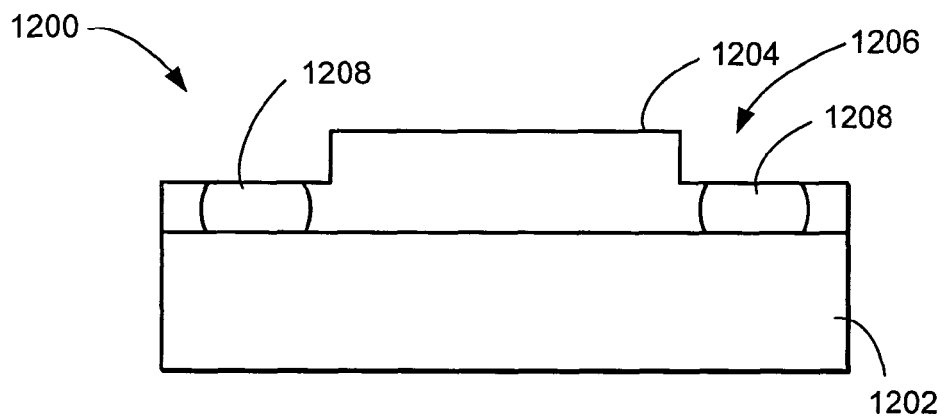
FIG. 12 is a cross-sectional view of a first chip package in accordance with a further embodiment of the present invention.

Referring now to FIG. 12, therein is shown a cross-sectional view of a first chip package 1200 in accordance with an embodiment of the present invention. The first chip package 1200 includes a die 1202 with interconnects 1208 encapsulated in a molding compound 1204. Recesses 1206 are formed into the edges of the molding compound 1204. The recesses 1206 partially expose the interconnects 1208. The grooves 1206 can be on two sides of the first chip package 1200 or on all four sides for quad-packages.

Figure 13:
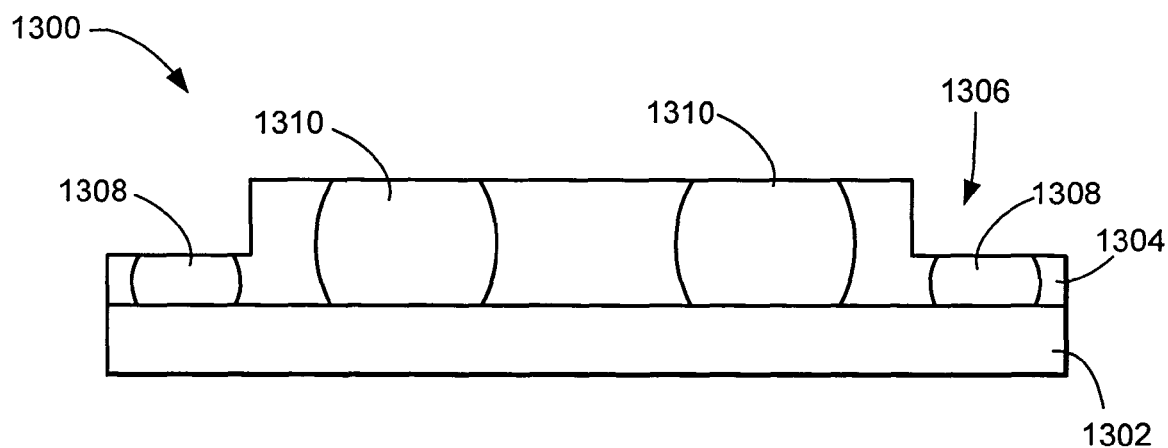
FIG. 13 is a cross-sectional view of a second chip package in accordance with a still further embodiment of the present invention.

Referring now to FIG. 13, therein is shown a cross-sectional view of a second chip package 1300 in accordance with a still further embodiment of the present invention. The second chip package 1300 includes a die 1302 with small interconnects 1308 and large interconnects 1310 encapsulated in a molding compound 1304. Portions of the large interconnects 1310 are exposed. Recesses 1306 are formed into the edges of the molding compound 1304. The recesses 1306 expose portions of the small interconnects 1308. The recesses 1306 can be on two sides of the second chip package 1300 or on all four sides for quad-packages.

In one embodiment, the small interconnects 1308 have a height of 50 to 125 μm and the large interconnects 1310 have a height of 250 to 300 μm.

Figure 14:
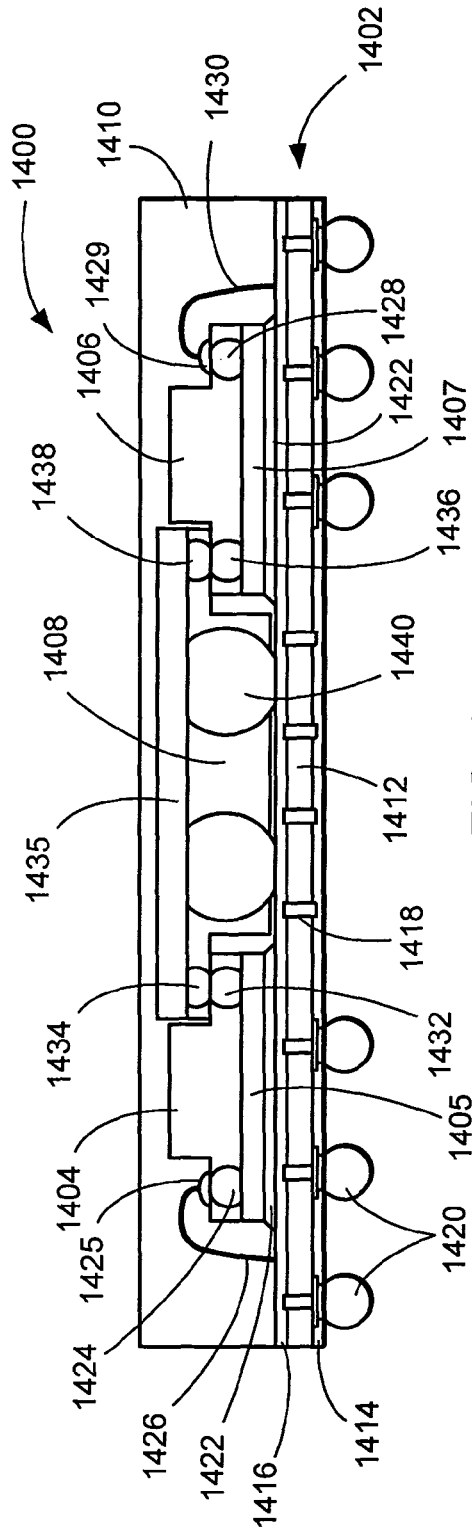
FIG. 14 is a cross-sectional view of a first multi-chip package system in accordance with an embodiment of the present invention.

Referring now to FIG. 14, therein is shown a cross-sectional view of a multi-chip package system 1400 in accordance with an embodiment of the present invention. The multi-chip package system 1400 includes a package board 1402, a first chip package 1404, a second chip package 1406, and a third chip package 1408. The first chip package 1404, the second chip package 1406, and the third chip package 1408 are encapsulated within an encapsulant 1410, such as a molding compound. The package board 1402 includes a substrate 1412 sandwiched between a first wiring layer 1414 and a second wiring layer 1416. Vias 1418 electrically connect the first wiring layer 1414 and the second wiring layer 1416. Solder balls 1420 are mounted to the first wiring layer 1414 electrically connecting some of the vias 1418.

The first and second chip packages 1404 and 1406 are similar to the chip package 1200 of FIG. 12. The third chip package 1408 is similar to the chip package 1300 of FIG. 13.

A first die 1405 of the first chip package 1404 and a second die 1407 of the second chip package 1406 are die attached to the package board 1402 by an adhesive 1422. A first interconnect 1424 of the first chip package 1404 includes a first wire bond 1425 that is electrically connected to the second wiring layer 1416 by a first electrical connector or bond wire 1426. A first interconnect 1428 of the second chip package 1406 includes a second wire bond 1429 that is electrically connected to the second wiring layer 1416 by a second electrical connector or bond wire 1430. A second interconnect 1432 of the first chip package 1404 is in contact with a first small interconnect 1434 of a die 1435 of the third chip package 1408. A second interconnect 1436 of the second chip package 1406 is in contact with a second small interconnect 1438 of the third chip package 1408. Large interconnects 1440 of the die 1435 are in contact with the second wiring layer 1416.

The multi-chip package system 1400 may be of a MCM type or MCM-SiP (with attached passive components). The multi-chip package system 1400 may be of a laminate package. The third chip package 1408 can include a live device or a dummy die. The live device can be either a chip or an integrated passive device (IPD). The dummy die may consist of a silicon die with RDL layers to provide electrical connection between the small interconnects and large interconnects.

Figure 15:
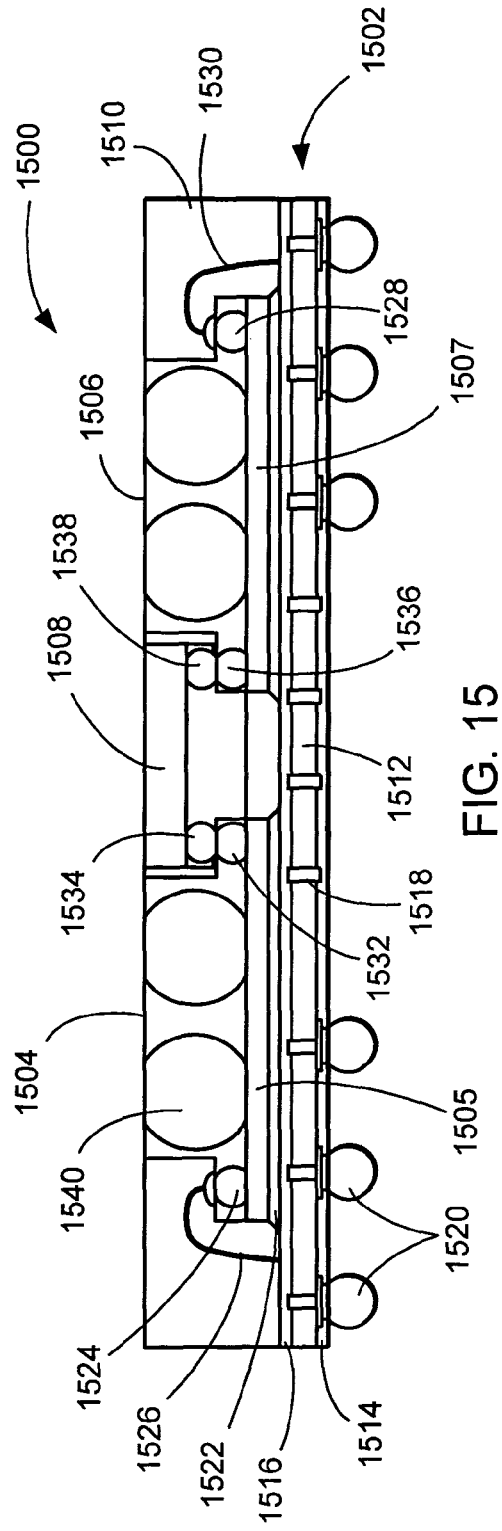
FIG. 15 is a cross-sectional view of a second multi-chip package system in accordance with an embodiment of the present invention.

Referring now to FIG. 15, therein is shown a cross-sectional view of a multi-chip package system 1500 in accordance with another embodiment of the present invention. The multi-chip package system 1500 includes a package board 1502, a first chip package 1504, a second chip package 1506, and a third chip package 1508. The first chip package 1504, the second chip package 1506, and the third chip package 1508 are partially encapsulated within an encapsulant 1510, such as a molding compound. The package board 1502 includes a substrate 1512 sandwiched between a first wiring layer 1514 and a second wiring layer 1516. Vias 1518 electrically connect the first wiring layer 1514 and the second wiring layer 1516. Solder balls 1520 are mounted to the first wiring layer 1514 electrically connecting some of the vias 1518.

The first and second chip packages 1504 and 1506 are similar to the second chip package 1300 of FIG. 13. The third chip package 1508 is similar to the first chip package 1200 of FIG. 12.

A first and a second die 1505 and 1507 of the first and second chip packages 1504 and 1506, respectively, are die attached to the second wiring layer 1516 by adhesive 1522. A first small interconnect 1524 of the first chip package 1504 is electrically connected to the second wiring layer 1516 with a first electrically conductive wire 1526. A first small interconnect 1528 of the second chip package 1506 is electrically connected to the second wiring layer 1516 with a second electrically conductive wire 1530. A second small interconnect 1532 of the first chip package 1504 is in contact with a first interconnect 1534 of the third chip package 1508. A second small interconnect 1536 of the second chip package 1506 is in contact with a second interconnect 1538 of the third chip package 1508. A top portion of large interconnects 1540 of the first chip package 1504 and the second chip package 1506 are left exposed for stacking other die or chip packages.

Figure 16:
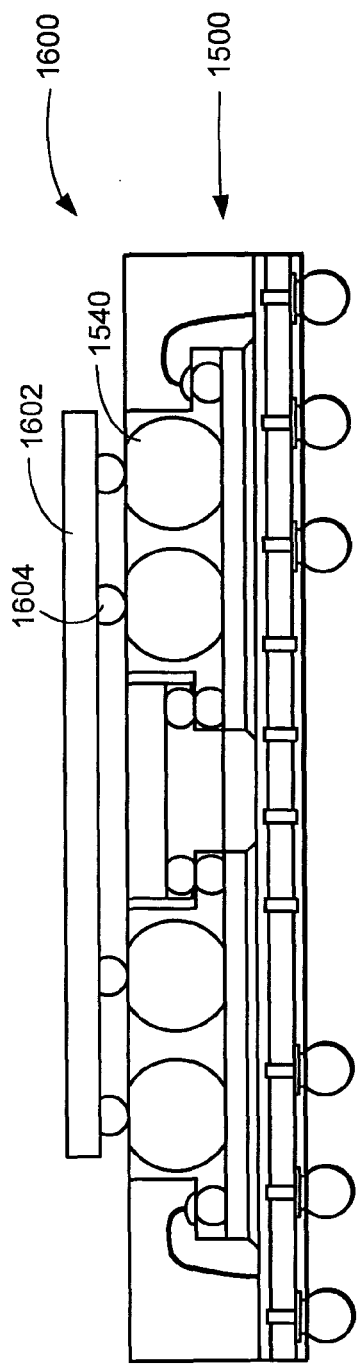
FIG. 16 is a cross-sectional view of a third multi-chip package system in accordance with an embodiment of the present invention.

Referring now to FIG. 16 is a cross-sectional view of a multi-chip package system 1600 in accordance with a further embodiment of the present invention. The multi-chip package system 1600 includes a chip 1602 mounted on the multi-chip package system 1500. The chip 1602 is electrically coupled to the top portion of the large interconnects 1540 with solder balls 1604.

Figure 17:
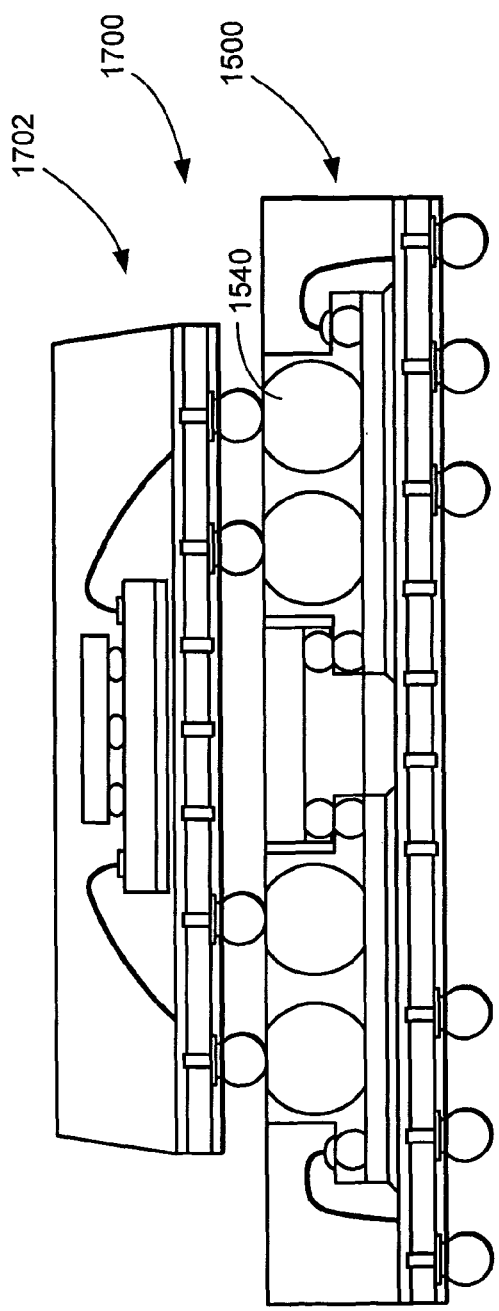
FIG. 17 is a cross-sectional view of a fourth multi-chip package system in accordance with an embodiment of the present invention.

Referring now to FIG. 17, therein is shown a cross-sectional view of a multi-chip package system 1700 in accordance with still another embodiment of the present invention. The multi-chip package system 1700 includes a chip package 1702 mounted on the multi-chip package system 1500. The chip package 1702 may include a BGA or a leaded type chip.

Figure 18:
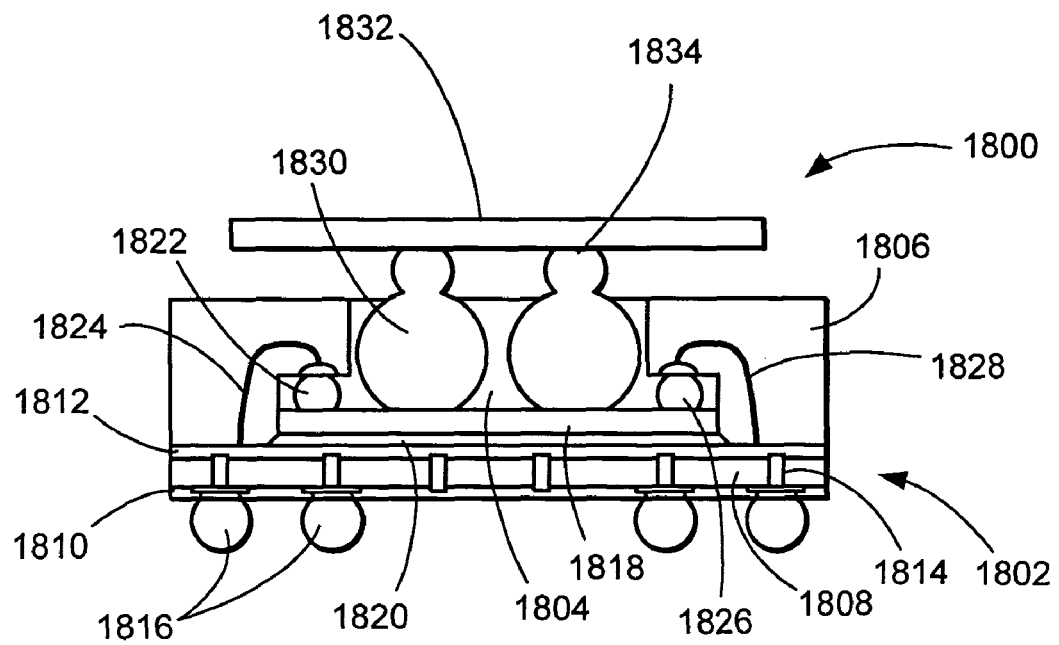
FIG. 18 is a cross-sectional view of a fifth multi-chip package system in accordance with an embodiment of the present invention.

Referring now to FIG. 18, therein is shown a cross-sectional view of a multi-chip package system 1800 in accordance with a still further embodiment of the present invention. The multi-chip package system 1800 includes a package board 1802, a first chip package 1804. The first chip package 1804 is partially encapsulated within a molding compound 1806. The package board 1802 includes a substrate 1808 sandwiched between a first circuit board 1810 and a second circuit board 1812. Vias 1814 electrically connect the first circuit board 1810 and the second circuit board 1812. Solder balls 1816 are mounted to the first circuit board 1810 electrically connecting some of the vias 1814.

The first chip package 1804 is similar to the second wafer package 1300 of FIG. 13. A semiconductor 1818 of the first chip package 1804 is attached to the second circuit board 1812 with an adhesive 1820. A first small interconnect 1822 of the first chip package 1804 is electrically connected to the second circuit board 1812 with a first electrical connector 1824. A second small interconnect 1826 of the first chip package 1804 is electrically connected to the second circuit board 1812 with a second electrical connector 1828. A top portion of large interconnects 1830 of the first chip package 1804 is exposed and connected to a second chip package 1832 via solder balls 1834.

Figure 19:
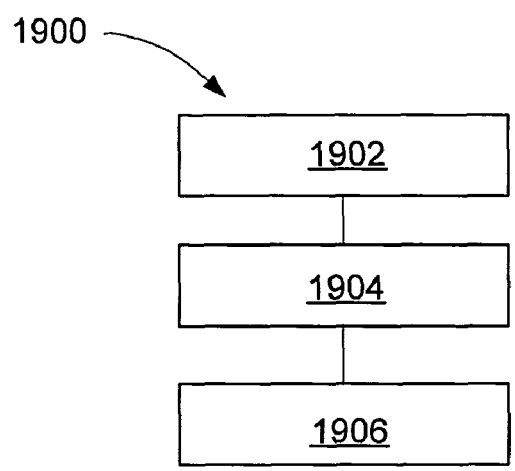
FIG. 19 is a flow chart of a system for fabricating the second wafer package system in accordance with an embodiment of the present invention.

Referring now to FIG. 19, therein is shown a flow chart of a multi-chip package system 1900 for fabricating a first chip package in accordance with an embodiment of the present invention. The system 1900 includes provided including providing a chip having interconnects provided thereon in a block 1902; forming a molding compound on the chip and encapsulating the interconnects in a block 1904; and forming a recess in the molding compound above the interconnects to expose the interconnects in a block 1906.

In greater detail, a method for fabricating the first chip package, according to an embodiment of the present invention, is performed as follows:
1. providing a wafer mold. (FIG. 6)
2. grinding a bottom surface of the wafer mold. (FIG. 7)
3. grinding a top surface of the wafer mold to exposed large interconnects. (FIG. 8)
4. mounting the wafer mold on a dicing tape. (FIG. 9)
5. cutting through a portion of the wafer mold with thick blades to expose the small interconnects. (FIG. 10)
6. cutting through the wafer mold with thin blades to separate into individual single die. (FIG. 11)

It has been discovered that the present invention thus has numerous aspects.

An aspect is that the present invention allows shorter die-to-die connection through various types of pre-encapsulated chip interconnects.

Yet another aspect of the present invention is that it valuably supports and services the historical trend of reducing costs, simplifying systems, and increasing performance.

These and other valuable aspects of the present invention consequently further the state of the technology to at least the next level.

The resulting processes and configurations are straightforward, cost-effective, uncomplicated, highly versatile and effective, can be implemented by adapting known technologies, and are thus readily suited for efficiently and economically manufacturing large die IC packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method for manufacturing a chip package system comprising:
   providing a chip having interconnects provided thereon;
   forming a molding compound on the chip and encapsulating the interconnects; and
   forming a groove in the molding compound and the interconnects to expose the interconnects and the molding compound in a coplanar surface.

2. The method as claimed in claim 1 further comprising:
   providing large interconnects on the chip that are larger than the interconnects;
   forming the molding compound on the chip encapsulates the large interconnects; and
   removing the molding compound above the large interconnects to expose the large interconnects.

3. The method as claimed in claim 1 further comprising:
   providing a package board having wiring layers provided thereon; and
   conductively connecting the interconnects to the wiring layers on the package board by the interconnects or by bond wires.

4. The method as claimed in claim 1 further comprising:
   providing a package board having wiring layers provided thereon;
   providing large interconnects on the chip that are larger than the interconnects;
   forming the molding compound on the chip to encapsulate the large interconnects;
   removing the molding compound above the large interconnects to expose the large interconnects; and
   conductively connecting the interconnects to the wiring layers on the package board by the large interconnects or bond wires.

5. The method as claimed in claim 1 further comprising:
   conductively connecting the interconnects on the chip to a second chip having small and large interconnects surrounded by the molding compound, the conductive connection at the small or large interconnects.

6. A method for manufacturing a chip package system comprising:
   providing a wafer having interconnects provided thereon;
   forming a molding compound on the wafer and encapsulating the interconnects;
   forming a groove in the molding compound and the interconnects to expose the interconnects and the molding compound in a coplanar surface having evidence of being sawn; and
   singulating the wafer to form first and second chip packages.

7. The method as claimed in claim 6 further comprising:
   providing large interconnects on the wafer that are larger than the interconnects;
   forming the molding compound on the wafer encapsulates the large interconnects;
   removing the molding compound above the large interconnects to expose the large interconnects; and
   the singulating the wafer forms third and fourth chip packages.

8. The method as claimed in claim 6 further comprising:
   providing a package board having wiring layers provided thereon;
   conductively connecting the interconnects to wiring layers on the package board by the interconnects, bond wires, or the first chip package through the second chip package.

9. The method as claimed in claim 6 further comprising:
   providing a package board having wiring layers provided thereon;
   providing small and large interconnects on a second wafer;
   forming a second molding compound on the second wafer to encapsulate the small and large interconnects;
   removing the second molding compound above the small and large interconnects to expose the small and large interconnects;
   singulating the second wafer to form third and fourth chip packages; and
   conductively connecting the interconnects of the first or third chip packages to the wiring layers on the package board by the interconnects, the small or large interconnects, bond wires, or through the second or fourth chip packages.

10. The method as claimed in claim 6 further comprising:
providing small and large interconnects on a second wafer;
forming a second molding compound on the second wafer to encapsulate the small and large interconnects;
removing the second molding compound above the small and large interconnects to expose the small and large interconnects;
singulating the second wafer to form third and fourth chip packages; and
conductively connecting two of the first, second, third, or fourth chip packages.

11. A chip package system comprising:
a chip having interconnects provided on the top thereof; and
a molding compound on the chip around the interconnects and having a groove in the top thereof includes the tops of the interconnects cut to be coplanar with the molding compound.

12. The system as claimed in claim 11 further comprising:
large interconnects on the chip that are larger than the interconnects; and
the molding compound on the chip around the large interconnects and exposing the tops of the large interconnects at the top of the molding compound.

13. The system as claimed in claim 11 further comprising:
a package board having wiring layers provided thereon; and
the interconnects conductively connected to the wiring layers on the package board by the interconnects or by bond wires.

14. The system as claimed in claim 11 further comprising:
a package board having wiring layers provided thereon;
large interconnects on the chip that are larger than the interconnects;
the molding compound on the chip around the large interconnects and exposing the tops of the large interconnects at the top of the molding compound; and
the interconnects and the large interconnects conductively connected to the wiring layers on the package board by the interconnects, the large interconnects, or bond wires.

15. The system as claimed in claim 11 further comprising:
the interconnects on the chip conductively connected to a second chip having small and large interconnects surrounded by the molding compound, the conductive connection at the small or large interconnects.

16. A chip package system comprising:
first and second chip packages characterized by being from the same wafer covered by a single molding compound; and
the first and second chip packages each comprises:
a chip having interconnects provided thereon, and
the molding compound on the chip around the interconnects and having a groove in the top thereof to includes the tops of the interconnects cut to be coplanar with the molding compound.

17. The system as claimed in claim 16 further comprising:
third and fourth chip packages characterized by being formed from the same wafer and covered by the single molding compound; and
the third and fourth chip packages each comprises:
a chip having large interconnects that are larger than the interconnects, and
the molding compound on the chip is around the large interconnects to expose the top of the large interconnects.

18. The system as claimed in claim 16 further comprising:
a package board having wiring layers provided thereon; and
the interconnects are conductively connected to wiring layers on the package board by the interconnects, bond wires, or the first chip package through the second chip package.

19. The system as claimed in claim 16 further comprising:
a package board having wiring layers provided thereon;
third and fourth chip packages wherein each chip package comprises:
a chip having large interconnects that are larger than the interconnects, and
a molding compound on the chip around the large interconnects and exposing the top of the large interconnects; and
the interconnects of the first or third chip packages conductively connected to the wiring layers on the package board by the interconnects, the small or large interconnects, bond wires, or through the second or fourth chip packages.

20. The system as claimed in claim 16 further comprising:
third and fourth chip packages wherein each chip package comprises:
a chip having large interconnects that are larger than the interconnects;
a molding compound on the chip around the large interconnects and exposing the top of the large interconnects; and
two of the first, second, third, or fourth chip packages are conductively connected.

* * * * *